(12) United States Patent
Xu et al.

(10) Patent No.: US 9,478,595 B2
(45) Date of Patent: Oct. 25, 2016

(54) DOUBLE-SIDED DISPLAY OLED ARRAY SUBSTRATE, ITS MANUFACTURING METHOD, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Liyan Xu, Beijing (CN); Chunbing Zhang, Beijing (CN)

(73) Assignees: BOE TECHNOLOGY GROUP CO., LTD., Beijing (CN); BEJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/417,491

(22) PCT Filed: May 26, 2014

(86) PCT No.: PCT/CN2014/078393
§ 371 (c)(1),
(2) Date: Jan. 26, 2015

(87) PCT Pub. No.: WO2015/096375
PCT Pub. Date: Jul. 2, 2015

(65) Prior Publication Data
US 2016/0020263 A1 Jan. 21, 2016

(30) Foreign Application Priority Data
Dec. 27, 2013 (CN) .......................... 2013 1 0741516

(51) Int. Cl.
*H01L 29/08* (2006.01)
*H01L 27/32* (2006.01)
(Continued)

(52) U.S. Cl.
CPC ....... *H01L 27/3267* (2013.01); *H01L 27/3248* (2013.01); *H01L 27/3262* (2013.01);
(Continued)

(58) Field of Classification Search
CPC ................. H01L 2227/323; H01L 2251/303; H01L 2251/5323; H01L 27/3248; H01L 27/3262; H01L 27/3267; H01L 27/3272; H01L 27/3276; H01L 29/423; H01L 29/42356; H01L 29/42384; H01L 29/6675; H01L 29/66969; H01L 29/786; H01L 29/78672; H01L 29/7869; H01L 51/56
USPC ............. 257/40, 59, 202, 88, 72; 438/29, 22
See application file for complete search history.

(56) References Cited

U.S. PATENT DOCUMENTS 5,396,083 A 3/1995 Kim et al.
9,173,272 B2 * 10/2015 Lee ........................ H05B 37/02
(Continued)

FOREIGN PATENT DOCUMENTS

CN 101373576 A 2/2009
CN 102044554 A 5/2011
(Continued)

OTHER PUBLICATIONS

First Office Action regarding Chinese application No. 201310741516.7, dated Oct. 10, 2015. Translation provided by Dragon Intellectual Property Law Firm.
(Continued)

*Primary Examiner* — Mohammed Shamsuzzaman
(74) *Attorney, Agent, or Firm* — Harness, Dickey & Pierce, P.L.C.

(57) ABSTRACT

The present disclosure provides a double-sided display OLED array substrate, its manufacturing method, and a display device. The double-sided display OLED array substrate includes a first base substrate, a second base substrate, a first OLED and a second OLED arranged between the first base substrate and the second base substrate, and a first TFT and a second TFT sharing an identical gate electrode and arranged between the first OLED and the second OLED, the first TFT being configured to drive the first OLED, and the second TFT being configured to drive the second OLED. According to the present disclosure, it is able to reduce a thickness of the double-sided display OLED array substrate, thereby to reduce the production cost thereof.

13 Claims, 7 Drawing Sheets

(51) Int. Cl.
  *H01L 29/423* (2006.01)
  *H01L 29/786* (2006.01)
  *H01L 29/66* (2006.01)
  *H01L 51/56* (2006.01)

(52) U.S. Cl.
  CPC ....... *H01L 27/3272* (2013.01); *H01L 27/3276* (2013.01); *H01L 29/423* (2013.01); *H01L 29/42356* (2013.01); *H01L 29/42384* (2013.01); *H01L 29/6675* (2013.01); *H01L 29/66969* (2013.01); *H01L 29/786* (2013.01); *H01L 29/7869* (2013.01); *H01L 29/78672* (2013.01); *H01L 51/56* (2013.01); *H01L 2227/323* (2013.01); *H01L 2251/303* (2013.01); *H01L 2251/5323* (2013.01)

(56) References Cited

U.S. PATENT DOCUMENTS

2004/0227159 A1* 11/2004 Nakashima .......... G09G 3/3225 257/202
2004/0245531 A1* 12/2004 Fuii .................... H01L 27/3267 257/88
2007/0114522 A1* 5/2007 Kwok .................. G09G 3/3216 257/40
2013/0200380 A1* 8/2013 Chang ................ H01L 27/3209 257/59

FOREIGN PATENT DOCUMENTS

| | | |
|---|---|---|
| CN | 102969311 A | 3/2013 |
| CN | 103247656 A | 8/2013 |
| CN | 103367353 A | 10/2013 |
| CN | 103730485 A | 4/2014 |
| TW | 201338102 A | 9/2013 |
| WO | WO-2012176422 A1 | 12/2012 |

OTHER PUBLICATIONS

Written Opinion of the International Searching Authority for international application No. PCT/CN2014/078393.

* cited by examiner

| base substrate |
|---|
| OLED |
| TFT |
| base substrate |
| TFT |
| OLED |
| base substrate |

Fig.1

| first base substrate |
|---|
| first OLED |
| first TFT |
| second TFT |
| second OLED |
| second base substrate |

DOUBLE-SIDED DISPLAY OLED ARRAY SUBSTRATE, ITS MANUFACTURING METHOD, AND DISPLAY DEVICE

CROSS-REFERENCE TO RELATED APPLICATIONS

The present application is the U.S. national phase of PCT Application No. PCT/CN2014/078393 filed on May 26, 2014, which claims priority to the Chinese application No. 201310741516.7 filed on Dec. 27, 2013, the entire contents of which are incorporated herein by reference.

TECHNICAL FIELD

The present disclosure relates to the field of display technology, in particular to a double-sided display organic light-emitting diode (OLED) array substrate, its manufacturing method, and a display device.

BACKGROUND

As shown in FIG. 1, an existing double-sided display OLED array substrate includes three base substrates and two thin film transistors with structures independent of each other. The OLED array substrate with such a structure has a large thickness, and as a result, the production cost thereof is relatively high.

SUMMARY

An object of the present disclosure is to provide a double-sided display OLED array substrate, its manufacturing method and a display device, so as to reduce a thickness of the double-sided display OLED array substrate, thereby to reduce the production cost thereof.

In one aspect, the present disclosure provides an OLED array substrate, including a first base substrate, a second base substrate, and a first OLED and a second OLED arranged between the first base substrate and the second base substrate. The OLED array substrate further includes:

a first TFT and a second TFT sharing an identical gate electrode and arranged between the first OLED and the second OLED, the first TFT being configured to drive the first OLED, and the second TFT being configured to drive the second OLED.

Alternatively, a structure of the first TFT and the second TFT sharing the identical gate electrode includes a first source/drain electrode, a first active layer, a first gate insulating layer, the gate electrode, a second gate insulating layer, a second active layer and a second source/drain electrode.

Alternatively, the first TFT includes the first source/drain electrode, the first active layer, the first gate insulating layer and the gate electrode arranged sequentially, and the second TFT includes the gate electrode, the second gate insulating layer, the second active layer and the second source/drain electrode arranged sequentially.

Alternatively, the first OLED and the second OLED each includes a cathode, a light-emitting layer and an anode.

Alternatively, the cathode may be a semitransparent cathode, and the anode may be a transparent or reflective anode.

Alternatively, when the anode is a transparent anode, the first TFT further includes a first light shielding layer arranged between a channel region, formed between the first source electrode and the first drain electrode, and the first OLED, and configured to shield the light from the first OLED toward the channel region formed between the first source electrode and the first drain electrode. The second TFT further includes a second light shielding layer arranged between a channel region, formed between the second source electrode and the second drain electrode, and the second OLED, and configured to shield the light from the second OLED toward the channel region formed between the second source electrode and the second drain electrode.

Alternatively, the duple OLED array substrate further includes:

a first insulating layer, a first data line, a first gate line and a first protection layer arranged between the first OLED and the first TFT, the first data line being connected to the anode of the first OLED and the drain electrode of the first TFT, and the first gate line being connected to the gate electrode; and a second gate insulating layer, a second data line, a second gate line and a second protection layer arranged between the second OLED and the second TFT, the second data line being connected to the anode of the second OLED and the drain electrode of the second TFT, and the second gate line being connected to the gate electrode.

Alternatively, the first active layer and the second active layer are each made of an oxide semiconductor material or a poly-Si material.

In another aspect, the present disclosure provides a display device including the above-mentioned double-sided display OLED array substrate.

In yet another aspect, the present disclosure provides a method for manufacturing a double-sided display OLED array substrate, including the steps of:

forming a first OLED on a first base substrate;

forming a first TFT and a second TFT sharing an identical gate electrode on the first OLED; and forming a second OLED on the second TFT, and providing a second base substrate on the second OLED, wherein the first TFT is configured to drive the first OLED, and the second TFT is configured to drive the second OLED.

Alternatively, the step of forming the first OLED on the first base substrate includes:

preparing a cathode of the first OLED on the first base substrate;

preparing a light-emitting layer of the first OLED on the cathode of the first OLED; and preparing an anode of the first OLED on the light-emitting layer of the first OLED.

Alternatively, the step of forming the first TFT and the second TFT sharing the identical gate electrode on the first OLED includes:

forming a first source electrode and a first drain electrode on the first OLED;

forming a first active layer on the first source electrode and the first drain electrode;

forming a first gate insulating layer on the first active layer;

forming the gate electrode on the first gate insulating layer;

forming a second gate insulating layer on the gate electrode;

forming a second active layer on the second gate insulating layer; and forming a second source electrode and a second drain electrode on the second active layer.

Alternatively, the step of forming the first TFT and the second TFT sharing the identical gate electrode on the first OLED includes:

forming a first source electrode and a first drain electrode on the first OLED;

forming a first light shielding layer on the first source electrode and the first drain electrode, the first light shielding layer being arranged between a channel region, formed between the first source electrode and the first drain electrode, and the first OLED, and configured to shield the light from the first OLED toward the channel region between the first source electrode and the first drain electrode;

forming a first active layer on the first light shielding layer;

forming a first gate insulating layer on the first active layer;

forming the gate electrode on the first gate insulating layer;

forming a second gate insulating layer on the gate electrode;

forming a second active layer on the second gate insulating layer;

forming a second light shielding layer on the second active layer; and forming a second source electrode and a second drain electrode on the second light shielding layer, the second light shielding layer being arranged between a channel region, formed between the second source electrode and the second drain electrode, and the second OLED, and configured to shield the light from the second OLED toward the channel region formed between the second source electrode and the second drain electrode.

Alternatively, the step of forming the second OLED on the second TFT and providing the second base substrate on the second OLED includes:

preparing an anode of the second OLED on the second TFT;

preparing a light-emitting layer of the second OLED on the anode of the second OLED;

preparing a cathode of the second OLED on the light-emitting layer of the second OLED; and providing the second base substrate on the cathode of the second OLED.

Alternatively, subsequent to forming the first OLED on the first base substrate and prior to forming the first TFT and the second TFT sharing the identical gate electrode on the first OLED, the method further includes a step of: forming a first insulating layer, a first data line, a first gate line and a first protection layer between the first OLED and the first TFT, the first data line being connected to the anode of the first OLED and the drain electrode of the first TFT, and the first gate line being connected to the gate electrode.

Subsequent to forming the first TFT and the second TFT sharing the identical gate electrode on the first OLED and prior to forming the second OLED on the second TFT, the method further includes a step of: forming a second insulating layer, a second data line, a second gate line and a second protection layer between the second OLED and the second TFT, the second data line being connected to the anode of the second OLED and the drain electrode of the second TFT, and the second gate line being connected to the gate electrode.

The present disclosure has the following advantageous effect. As compared with a traditional OLED array substrate, the two TFTs in the double-sided display OLED array substrate share the identical gate electrode and merely two base substrates are required. As a result, it is able to reduce the thickness of the array substrate, thereby to reduce the production cost thereof.

BRIEF DESCRIPTION OF THE DRAWINGS

FIG. 1 is a schematic view showing an existing double-sided display OLED array substrate;

FIG. 2 is a schematic view showing a double-sided display OLED array substrate according to one embodiment of the present disclosure;

DETAILED DESCRIPTION

In order to make the objects, the technical solutions and the advantages of the present disclosure more apparent, the present disclosure will be described hereinafter in conjunction with the drawings and the embodiments.

Referring to FIG. 2, which is a schematic view showing a double-sided display OLED array substrate according to one embodiment of the present disclosure, the double-sided display OLED array substrate includes:

a first base substrate and a second base substrate;

a first OLED and a second OLED arranged between the first base substrate and the second base substrate; and a first TFT and a second TFT sharing an identical gate electrode and arranged between the first OLED and the second OLED, the first TFT being configured to drive the first OLED, and the second TFT being configured to drive the second OLED.

The first base substrate and the second base substrate may each be made of glass, quartz, etc.

In the double-sided display OLED array substrate, the first TFT and the second TFT share the identical gate electrode and merely two base substrates are required. As compared with a traditional OLED array substrate, it is able to reduce a thickness of the double-sided display OLED array substrate, thereby to reduce the production cost thereof.

Figure 3:
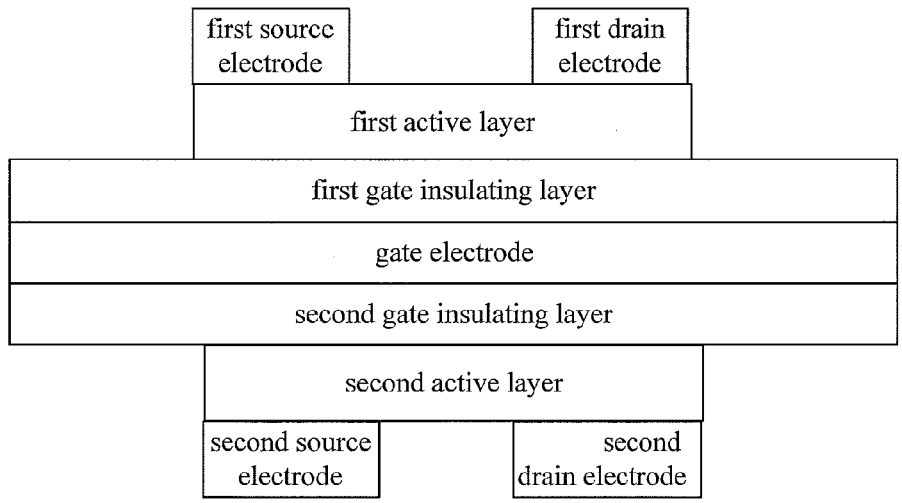
FIG. 3 is a schematic view showing a structure of a first TFT and a second TFT sharing an identical gate electrode according to one embodiment of the present disclosure.

Referring to FIG. 3, which is a schematic view showing a structure of the first TFT and the second TFT sharing the identical gate electrode according to one embodiment of the present disclosure, the structure of the first TFT and the second TFT sharing the identical gate electrode includes a first source/drain electrode, a first active layer, a first gate insulating layer, the gate electrode, a second gate insulating layer, a second active layer and a second source/drain electrode.

As shown in FIG. 3, the first TFT and the second TFT share the identical gate electrode, and as compared with the two TFTs in the traditional double-sided display OLED array substrate, one base substrate and one gate electrode are reduced. As a result, it is able to reduce the thickness of the double-sided display OLED array substrate, thereby to reduce the production cost thereof.

In the embodiment as shown in FIG. 3, the first TFT and the second TFT are each of a top-gate structure, i.e., the gate electrode is arranged above the source/drain electrode. Of course, in the other embodiments of the present disclosure, the gate electrode of the first TFT and the second TFT may also be arranged beside the source/drain electrode.

The first OLED and the second OLED each includes a cathode, a light-emitting layer and an anode. The cathode may be a semitransparent cathode, and the anode may be a transparent or reflective anode.

When the anode is a reflective anode, the first OLED and the second OLED emit light in a one-way manner toward an exterior of the OLED array substrate.

When the anode is a transparent anode, the first OLED and the second OLED emit light in a two-way manner toward both the exterior of the OLED array substrate and an interior of the OLED array substrate. The light emitted from the first OLED and the second OLED toward the interior of the OLED array substrate will affect channels of the first TFT and the second TFT inside the OLED array substrate.

In this embodiment, in order to prevent the light emitted from the first OLED and the second OLED which emit light in a two-way manner from affecting the channels of the first TFT and the second TFT, light shielding layers may be arranged in the first TFT and the second TFT, respectively.

Figure 4:
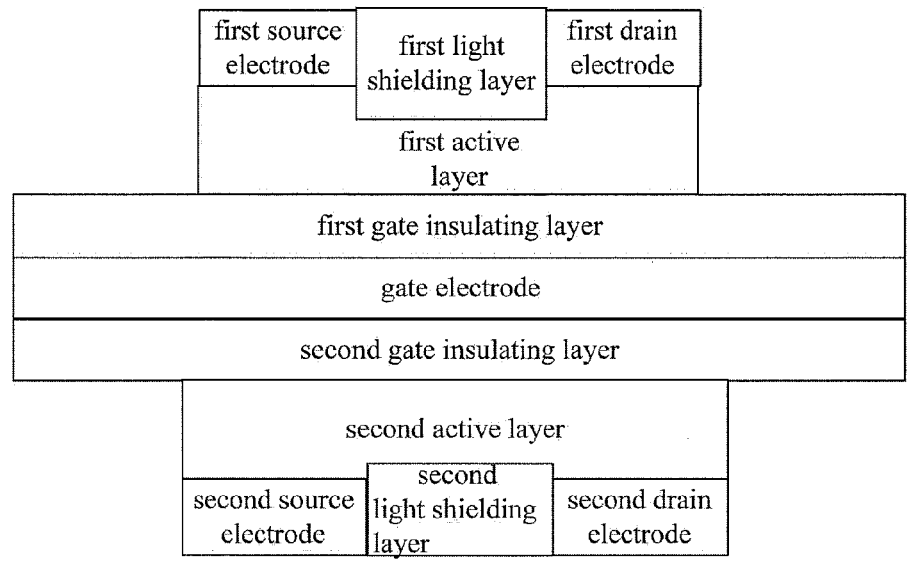
FIG. 4 is a schematic view showing another structure of the first TFT and the second TFT sharing the identical gate electrode according to one embodiment of the present disclosure.

To be specific, as shown in FIG. 4, the first TFT may further include a first light shielding layer arranged between a channel region, formed between the first source electrode and the first drain electrode, and the first OLED, and configured to shield the light from the first OLED toward the channel region formed between the first source electrode and the first drain electrode.

The second TFT may further include a second light shielding layer arranged between a channel region, formed between the second source electrode and the second drain electrode, and the second OLED, and configured to shield the light from the second OLED toward the channel region formed between the second source electrode and the second drain electrode.

The active layers (i.e., the first active layer and the second active layer) in the first TFT and the second TFT may be made of an oxide semiconductor material or a poly-Si semiconductor material. As compared with a traditional TFT where an active layer is made of a mono-Si semiconductor material, it is able to reduce a channel length of the TFT, thereby to improve an aperture ratio of a display device.

Figure 6:
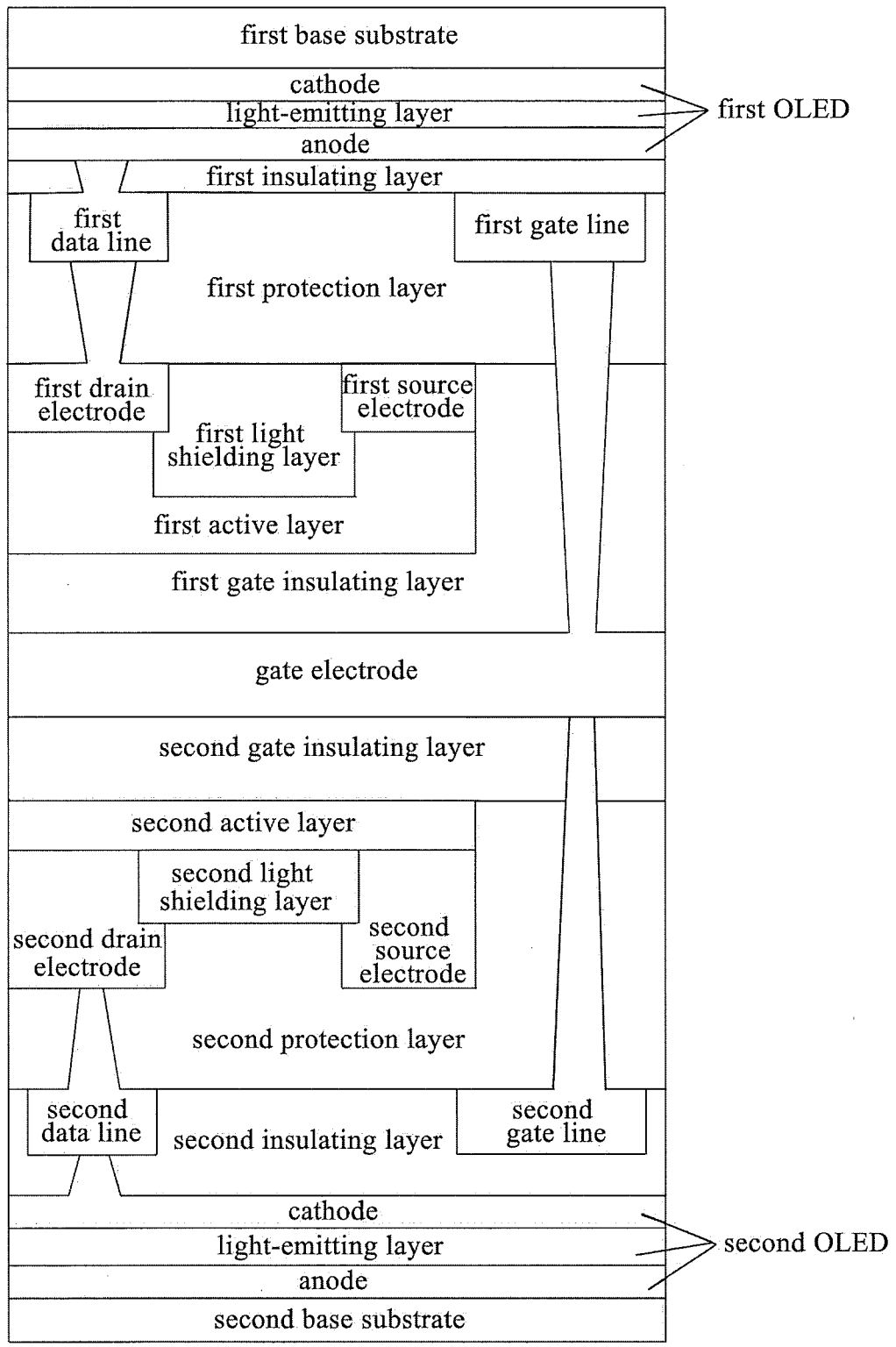
FIG. 6 is a schematic view showing the double-sided display OLED array substrate manufactured by the method in FIGS. 5A-5H.

Further, as shown in FIG. 6, the double-sided display OLED array substrate of the present disclosure may further include:

a first insulating layer, a first data line, a first gate line and a first protection layer arranged between the first OLED and the first TFT, the first data line being connected to the anode of the first OLED and the drain electrode of the first TFT, and the first gate line being connected to the gate electrode and arranged at an identical layer to, or at different layers from, the first data line; and a second gate insulating layer, a second data line, a second gate line and a second protection layer arranged between the second OLED and the second TFT, the second data line being connected to the anode of the second OLED and the drain electrode of the second TFT, and the second gate line being connected to the gate electrode and arranged at an identical layer to, or at different layers from, the second data line.

Correspondingly, the present disclosure further provides a method for manufacturing the above-mentioned double-sided display OLED array substrate, including:

Step 1: forming the first OLED on the first base substrate;
Step 2: forming the first TFT and the second TFT sharing the identical gate electrode on the first OLED; and Step 3: forming the second OLED on the second TFT, and providing the second base substrate on the second OLED, wherein the first TFT is configured to drive the first OLED, and the second TFT is configured to drive the second OLED.

Further, the step of forming the first OLED on the first base substrate includes:

preparing the cathode of the first OLED on the first base substrate;
preparing the light-emitting layer of the first OLED on the cathode of the first OLED; and
preparing the anode of the first OLED on the light-emitting layer of the first OLED.

Further, the step of forming the first TFT and the second TFT sharing the identical gate electrode on the first OLED includes:

forming the first source electrode and the first drain electrode on the first OLED;
forming the first active layer on the first source electrode and the first drain electrode;
forming the first gate insulating layer on the first active layer;
forming the gate electrode on the first gate insulating layer;
forming the second gate insulating layer on the gate electrode;
forming the second active layer on the second gate insulating layer; and
forming the second source electrode and the second drain electrode on the second active layer.

Further, the step of forming the second OLED on the second TFT and providing the second base substrate on the second OLED includes:

preparing the anode of the second OLED on the second TFT;
preparing the light-emitting layer of the second OLED on the anode of the second OLED;
preparing the cathode of the second OLED on the light-emitting layer of the second OLED; and
providing the second base substrate on the cathode of the second OLED.

Alternatively, the step of forming the first TFT and the second TFT sharing the identical gate electrode on the first OLED may further include:

forming the first source electrode and the first drain electrode on the first OLED;
forming a first light shielding layer on the first source electrode and the first drain electrode, the first light shielding layer being arranged between a channel region, formed between the first source electrode and the first drain electrode, and the first OLED, and configured to shield the light from the first OLED toward the channel region between the first source electrode ad the first drain electrode;
forming the first active layer on the first light shielding layer;
forming the first gate insulating layer on the first active layer;
forming the gate electrode on the first gate insulating layer;
forming the second gate insulating layer on the gate electrode;
forming the second active layer on the second gate insulating layer;
forming a second light shielding layer on the second active layer; and
forming the second source electrode and the second drain electrode on the second light shielding layer, the second light shielding layer being arranged between a channel region, formed between the second source electrode and the second drain electrode, and the second OLED, and configured to shield the light from the second OLED toward the channel region formed between the second source electrode and the second drain electrode.

In some embodiments of the present disclosure, subsequent to forming the first OLED on the first base substrate and prior to forming the first TFT and the second TFT sharing the identical gate electrode on the first OLED, the method further includes: forming a first insulating layer, a first data line, a first gate line and a first protection layer between the first OLED and the first TFT, the first data line being connected to the anode of the first OLED and the drain electrode of the first TFT, and the first gate line being connected to the gate electrode.

Subsequent to forming the first TFT and the second TFT sharing the identical gate electrode on the first OLED and prior to forming the second OLED on the second TFT, the method further includes: forming a second insulating layer, a second data line, a second gate line and a second protection layer between the second OLED and the second TFT, the second data line being connected to the anode of the second OLED and the drain electrode of the second TFT, and the second gate line being connected to the gate line.

Referring to FIGS. 5A-5H, which are flow charts of the method for manufacturing the double-sided display OLED array substrate according to one embodiment of the present disclosure, the method includes the following steps.

Figure 5A:
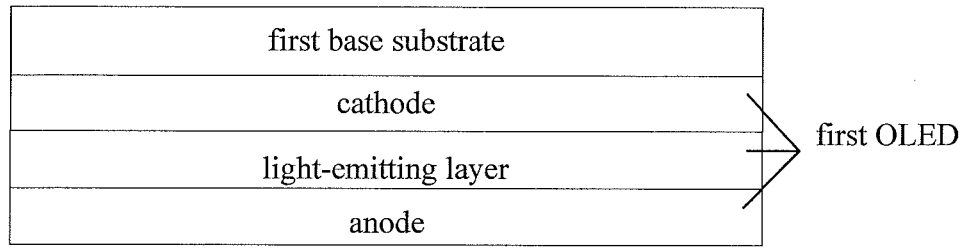
FIGS. 5A-5H are flow charts of a method for manufacturing a double-sided display OLED array substrate according to one embodiment of the present disclosure.

As shown in FIG. 5A, the first OLED is formed on the first base substrate, and it includes the cathode, the light-emitting layer and the anode formed sequentially. To be specific, the first base substrate may be made of glass, quartz, etc. The cathode may be a semitransparent cathode, and the anode may be a transparent or reflective anode. In this embodiment, the anode is a transparent one.

Figure 5B:
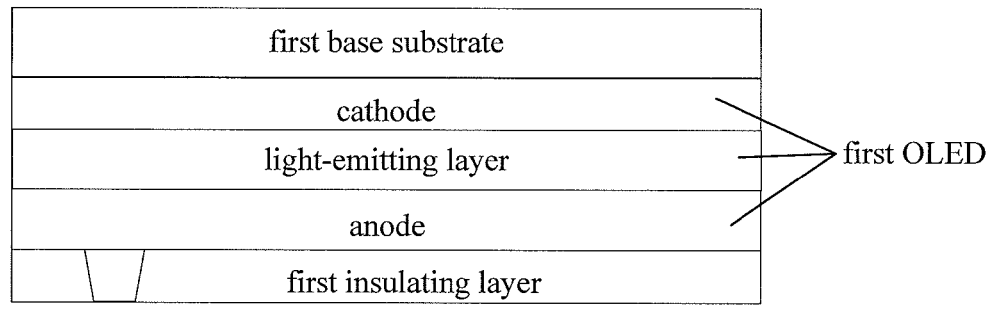

As shown in FIG. 5B, the first insulating layer is formed on the anode of the first OLED and apertures are formed in the first insulating layer. To be specific, the first insulating layer may be made of SiNx, and in this step, the apertures may be formed in the first insulating layer by dry etching.

Figure 5C:
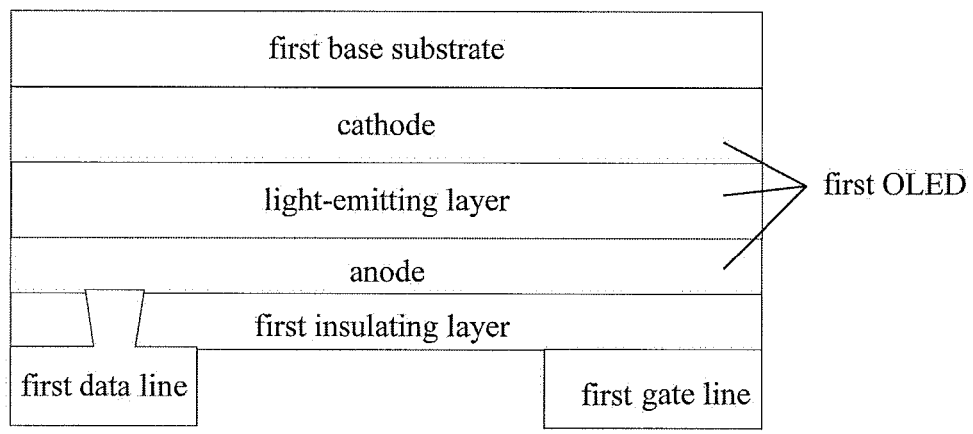

As shown in FIG. 5C, the first data line and the first gate line are formed on the first insulating layer. When forming the first data line and the first gate line, a metal for forming the first data line and the first gate line is filled into the apertures in the first insulating layer, so that the first data line is connected to the anode of the first OLED.

Figure 5D:
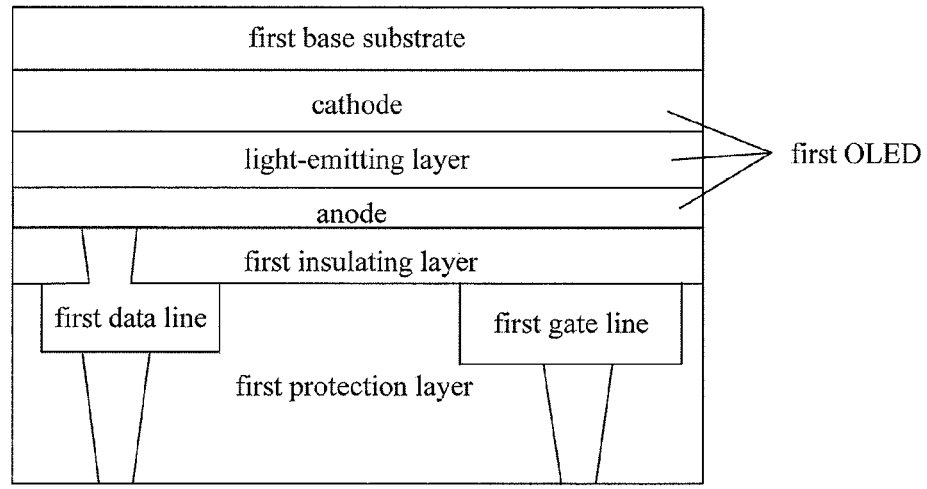

As shown in FIG. 5D, the first protection layer is formed on the first data line and the first gate line, and two apertures are formed in the first protection layer, one of which corresponds to the first data line and the other of which corresponds to the first gate line. To be specific, the first protection layer may be made of SiNx, and in this step, the apertures may be formed in the first protection layer by dry etching. After the first protection layer is formed, ideally an upper surface of the first protection layer is flat. In the actual operation, if a member under the first protection layer is not flat, the upper surface of the resultant protection layer will not be flat either, which however will not affect the implementation of the present disclosure. In order to achieve a better effect, such a process as etching may be used so as to make the upper surface thereof flat, and so do a light shielding-insulating film, a semiconductor film and the first gate insulating layer film formed subsequently.

Figure 5E:
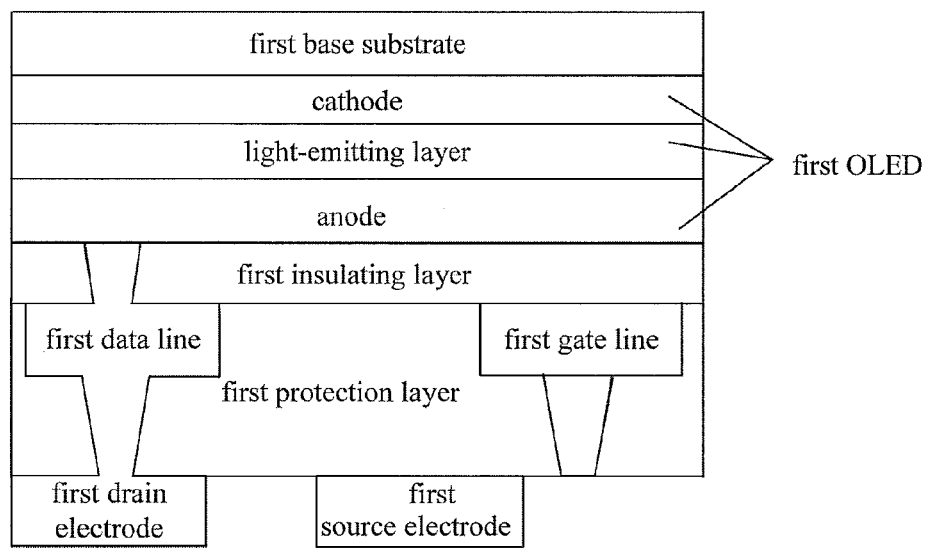

As shown in FIG. 5E, the first source electrode and the first drain electrode of the first TFT are formed on the first protection layer. In this step, the first source electrode and the first drain electrode may be formed by wet etching. When the first source electrode and the first drain electrode are formed, a metal for forming the first source electrode and the first drain electrode is filled into the apertures in the first protection layer (including the apertures corresponding to the first data line and the apertures corresponding to the first gate line), so that the first data line is connected to the first drain electrode.

Figure 5F:
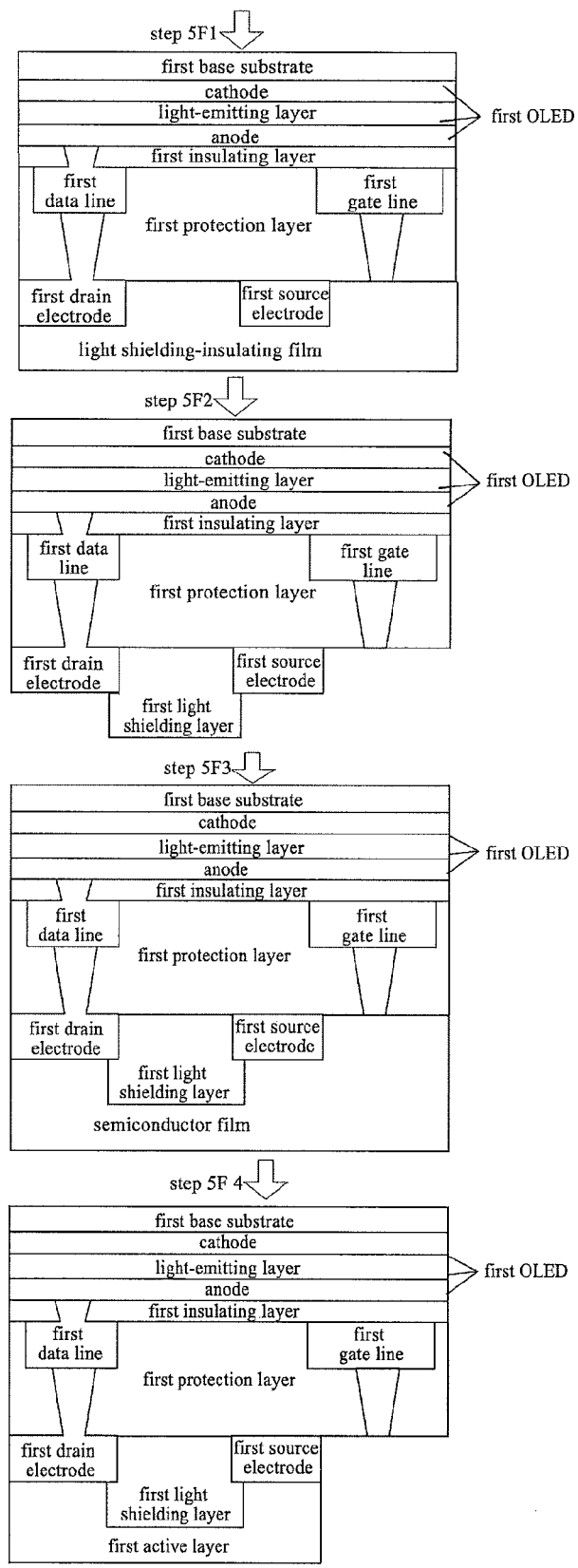

As shown in FIG. 5F, the first light shielding layer and the first active layer are formed on the first source electrode and the first drain electrode. The first light shielding layer is arranged between the channel region, formed between the first source electrode and the first drain electrode, and the first OLED, and configured to shield the light from the first OLED toward the channel region formed between the first source electrode and the first drain electrode.

The step of forming the first light shielding layer and the first active layer on the first source electrode and the first drain electrode may include:

Step 5F1: applying the light shielding-insulating film onto the first source electrode and the first drain electrode;

Step 5F2: forming a pattern of the first light shielding layer by etching;

Step 5F3: applying the semiconductor film, which may be made of a poly-Si semiconductor material or an oxide semiconductor material, onto the first light shielding layer; and Step 5F4: forming a pattern of the first active layer by etching.

Figure 5G:
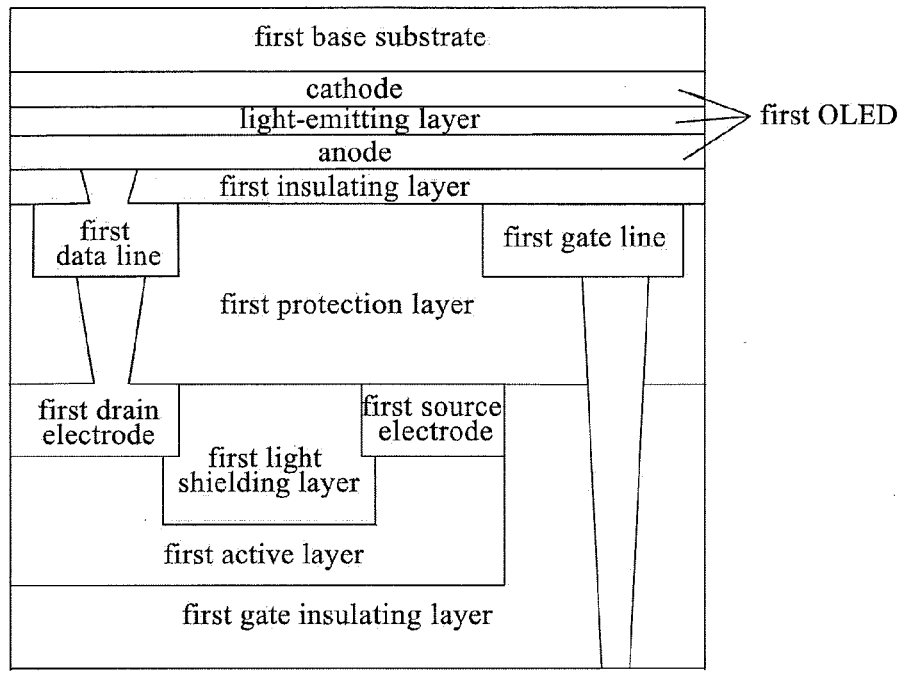

As shown in FIG. 5G, the first gate insulating layer is formed on the first active layer, and apertures are formed in the first gate insulating layer.

Figure 5H:
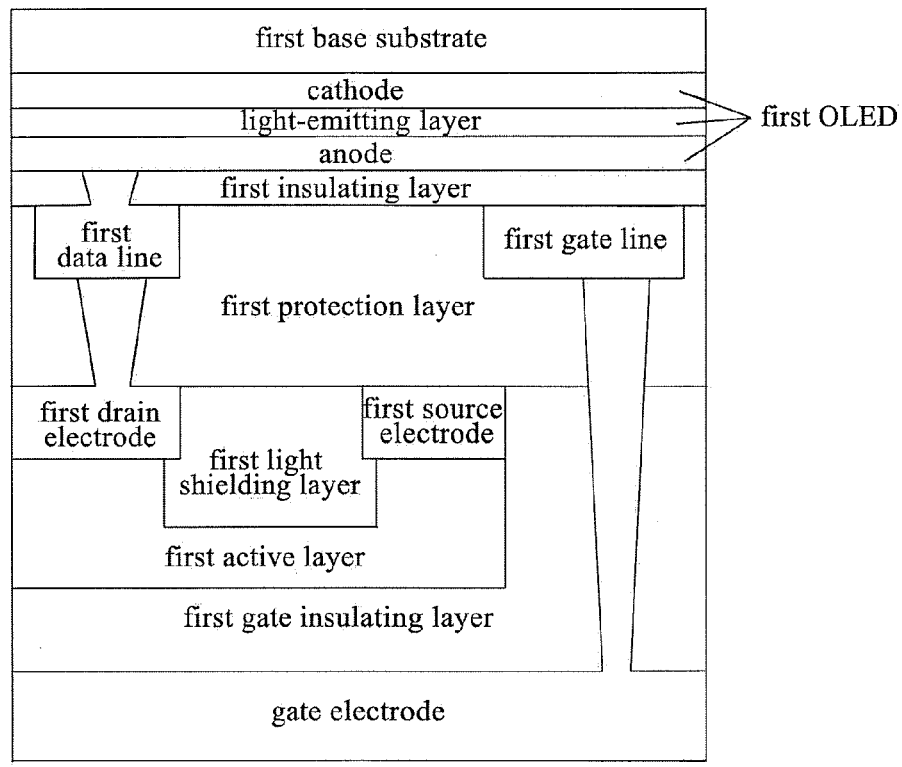

As shown in FIG. 5H, the gate electrode shared by the first TFT and the second TFT is formed on the first gate insulating layer. When the gate electrode is formed, a metal for forming the gate electrode is filled into the apertures formed in the first gate insulating layer so that the gate electrode is connected to the first gate line.

Then, the second gate insulating layer, the second active layer, the second light shielding layer and the second source/drain electrode of the second TFT, the second protection layer, the second data/gate line, the second insulating layer, and the anode, the light-emitting layer and the cathode of the second OLED are sequentially formed on the gate electrode. When the second protection layer is formed, it is also required to form apertures (in which a metal for forming the second gate line is filled) for connecting the gate electrode and the second gate line in the second protection layer and the second gate insulating layer, and to form apertures (in which a metal for fowling the second data line is filled) for connecting the second data line and the second drain electrode in the second protection layer and the second gate insulating layer. When the second insulating layer is formed, it is also required to form apertures (in which a metal for forming the anode of the second TFT is filled) for connecting the second data line and the anode of the second TFT in the second insulating layer.

It is to be noted that, the positions of the first source electrode and the first drain electrode of the first TFT in this embodiment may be replaced with each other, and so do the positions of the second source electrode and the second drain electrode of the second TFT.

FIG. 6 shows the double-sided display OLED array substrate manufactured by the method as shown in FIGS. 5A-5H.

What is claimed is:

1. A double-sided display organic light emitting diode (OLED) array substrate, comprising a first base substrate, a second base substrate, and a first OLED and a second OLED arranged between the first base substrate and the second base substrate, wherein the double-sided display OLED array substrate further comprises:
   a first thin film transistor (TFT) and a second TFT sharing an identical gate electrode and arranged between the first OLED and the second OLED, wherein the first TFT is configured to drive the first OLED, and the second TFT is configured to drive the second OLED,
   wherein a structure of the first TFT and the second TFT sharing the identical gate electrode comprises a first source electrode, a first drain electrode, a first active layer, a first gate insulating layer, the identical gate electrode arranged sequentially, a second gate insulating layer, a second active layer, a second source electrode and a second drain electrode arranged sequentially; and
   wherein a structure of the first OLED and second OLED comprises a first insulating layer, a first data line, a first gate line being connected to the identical gate electrode and a second insulating layer, a second data line, a second gate line being connected to the identical gate electrode.

2. The double-sided display OLED array substrate according to claim 1, wherein the first OLED and the second OLED each comprises a cathode, a light-emitting layer and an anode.

3. The double-sided display OLED array substrate according to claim 2, wherein the cathode is a semitransparent cathode, and the anode is a transparent or reflective anode.

4. The double-sided display OLED array substrate according to claim 3, wherein when the anode is a transparent anode,
   the first TFT further comprises a first light shielding layer arranged between a channel region that is formed between a first source electrode and a first drain electrode, and the first OLED, and configured to shield the light from the first OLED toward the channel region formed between the first source electrode and the first drain electrode, and
   the second TFT further comprises a second light shielding layer arranged between a channel region that is formed between a second source electrode and a second drain electrode, and the second OLED, and configured to shield the light from the second OLED toward the channel region formed between the second source electrode and the second drain electrode.

5. The double-sided display OLED array substrate according to claim 4, further comprising:
   a first protection layer arranged between the first OLED and the first TFT, the first data line being connected to the anode of the first OLED and the first drain electrode of the first TFT; and
   a second protection layer arranged between the second OLED and the second TFT, the second data line being connected to the anode of the second OLED and the second drain electrode of the second TFT.

6. The double-sided display OLED array substrate according to claim 1, wherein the first active layer and the second active layer are each made of an oxide semiconductor material or a poly-Si material.

7. A display device comprising the double-sided display OLED array substrate according to claim 1.

8. A method for manufacturing a double-sided display organic light emitting diode (OLED) array substrate comprising the steps of:
   forming a first base substrate;
   forming a second base substrate;
   forming a first OLED and a second OLED arranged between the first base substrate and the second base substrate;
   forming a first thin film transistor (TFT) and a second TFT sharing an identical gate electrode on the first OLED and the second OLED,
   the first TFT being configured to drive the first OLED, and the second TFT being configured to drive the second OLED;
   forming a structure of the first TFT and the second TFT sharing the identical gate electrode, wherein the structure includes a first source electrode, a first drain electrode, a first active layer, a first gate insulating layer, the identical gate electrode arranged sequentially, a second gate insulating layer, a second active layer, a second source electrode, and a second drain electrode arranged sequentially; and
   forming a structure of the first OLED and the second OLED, wherein the structure includes a first insulating layer, a first data line, a first gate line being connected to the identical gate electrode and a second insulating layer, and wherein a second data line and a second gate line are connected to the identical gate electrode.

9. The method according to claim 8 further comprising:
   preparing a cathode for the first OLED and the second OLED;
   preparing a light-emitting layer for the first OLED and the second OLED; and
   preparing an anode for the first OLED and the second OLED.

10. The method according to claim 8 further comprising
    forming the first active layer and
    the second active layer using an oxide semiconductor material or poly-material.

11. The method according to claim 9, wherein when the anode is a transparent anode, the method further comprises:
    forming a first light shielding layer between a channel region that is formed between the first source electrode and the first drain electrode, and the first OLED, and the first light shielding layer being configured to shield the light from the first OLED toward the channel region formed between the first source electrode and the first drain electrode; and and
    forming a second light shielding layer being arranged between a channel region that is formed between the second source electrode and the second drain electrode, and the second OLED, and the second light shielding layer being configured to shield the light from the second OLED toward the channel region formed between the second source electrode and the second drain electrode.

12. The method according to claim 8, wherein the anode is a transparent or reflective anode; and the cathode is a semitransparent cathode.

13. The method according to claim 8 further comprising:
forming a first protection layer between the first OLED and the first TFT, the first data line being connected to an anode of the first OLED and the first drain electrode of the first TFT; and
forming a second protection layer between the second OLED and the second TFT, the second data line being connected to an anode of the second OLED and the second drain electrode of the second TFT.

\* \* \* \* \*